United States Patent [19]
Dabrowiecki et al.

[11] Patent Number: 5,884,395
[45] Date of Patent: Mar. 23, 1999

[54] ASSEMBLY STRUCTURE FOR MAKING INTEGRATED CIRCUIT CHIP PROBE CARDS

[75] Inventors: Krzysztof Dabrowiecki, San Leandro; January Kister, Menlo Park; Jerzy Lobacz, San Mateo, all of Calif.

[73] Assignee: Probe Technology, Santa Clara, Calif.

[21] Appl. No.: 835,078

[22] Filed: Apr. 4, 1997

[51] Int. Cl.⁶ .............................. H01R 43/00; B23P 19/00
[52] U.S. Cl. .......................... 29/825; 29/592.1; 29/729; 324/754; 324/762
[58] Field of Search .......................... 29/825, 874, 882, 29/729, 592.1; 324/762, 754

[56] References Cited

U.S. PATENT DOCUMENTS

| | | |
|---|---|---|
| 4,382,228 | 5/1983 | Evans . |
| 4,523,144 | 6/1985 | Okubo et al. . |
| 4,599,559 | 7/1986 | Evans ...................................... 324/158 |
| 4,719,417 | 1/1988 | Evans ...................................... 324/158 |
| 4,757,256 | 7/1988 | Whann et al. . |
| 5,066,907 | 11/1991 | Tarzwell et al. . |
| 5,355,079 | 10/1994 | Evans et al. .............................. 324/754 |
| 5,389,885 | 2/1995 | Swart ....................................... 324/761 |
| 5,742,174 | 4/1998 | Kister et al. . |

*Primary Examiner*—Carl J. Arbes
*Attorney, Agent, or Firm*—Lumen Intellectual Property Services

[57] ABSTRACT

This disclosure proposes an assembly structure for building probe cards to test square integrated circuit chips. The test probe card assembly structure has one or more wings located at 90° angles to each other upon which probes are laid in a parallel manner for attachment to a probe card. This allows construction of the probe card so that probes touch contacts directly. The probe tips do not touch the contacts at an angle θ, called the fan out angle. The probes also do not differ in their inclination angles β. As a result, the force at which the many probe tips touch the contacts is relatively constant throughout. In addition, the probe tips are less likely to scrub past the surface of the contact onto the insulation surface of the chip and in doing so damage it. The test probe card assembly structure also contains an epoxy groove, which controls epoxy flow so that the position of the probes stays aligned in the correct plane. The epoxy groove also prevents variance in beam length.

21 Claims, 6 Drawing Sheets

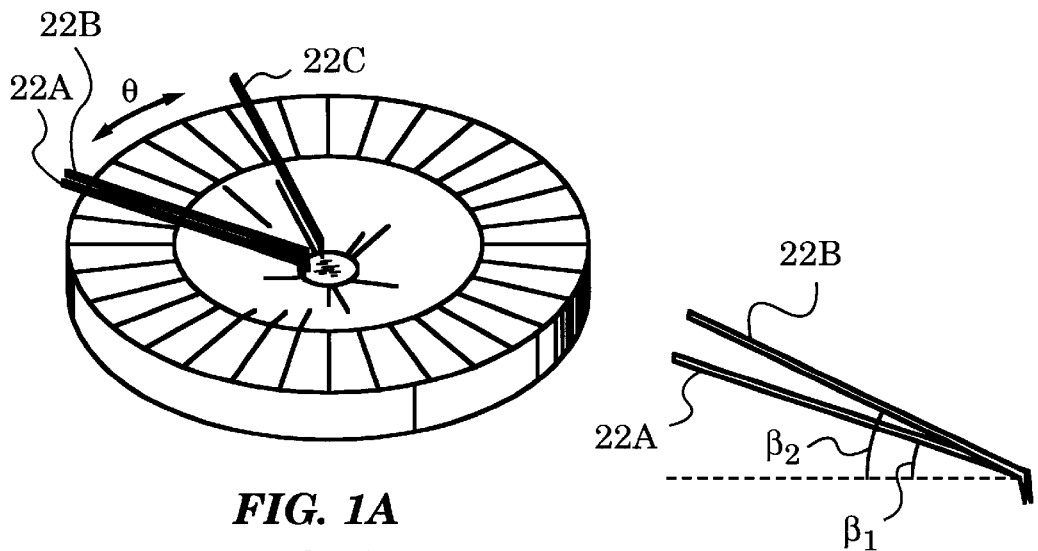
FIG. 1A
PRIOR ART
FIG. 1B
PRIOR ART
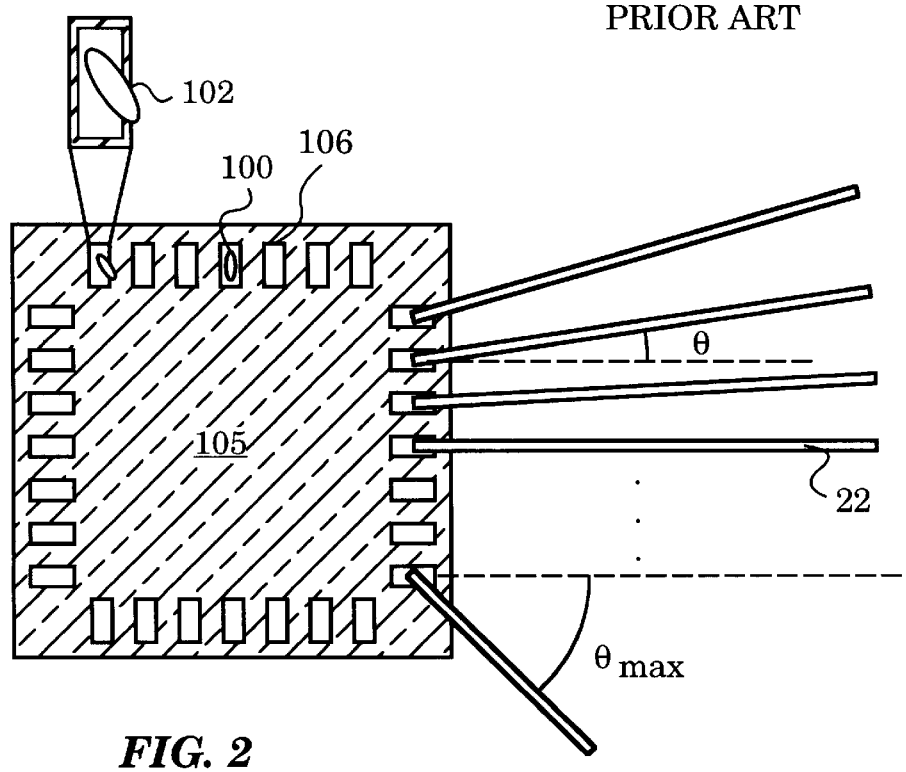
FIG. 2
PRIOR ART

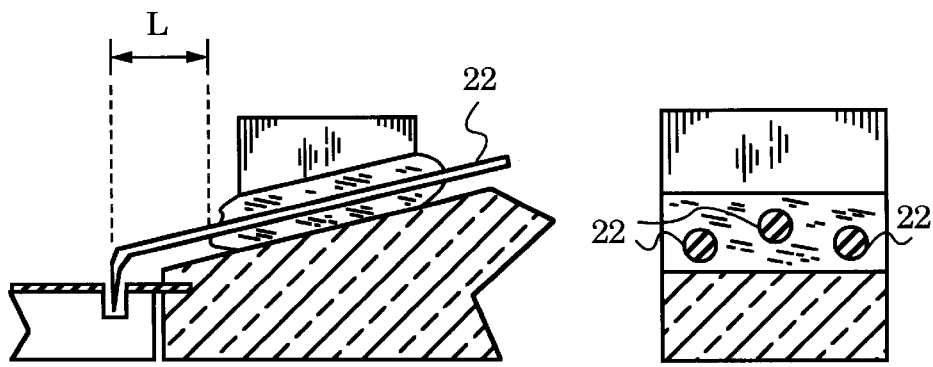
FIG. 3
PRIOR ART
FIG. 4
PRIOR ART
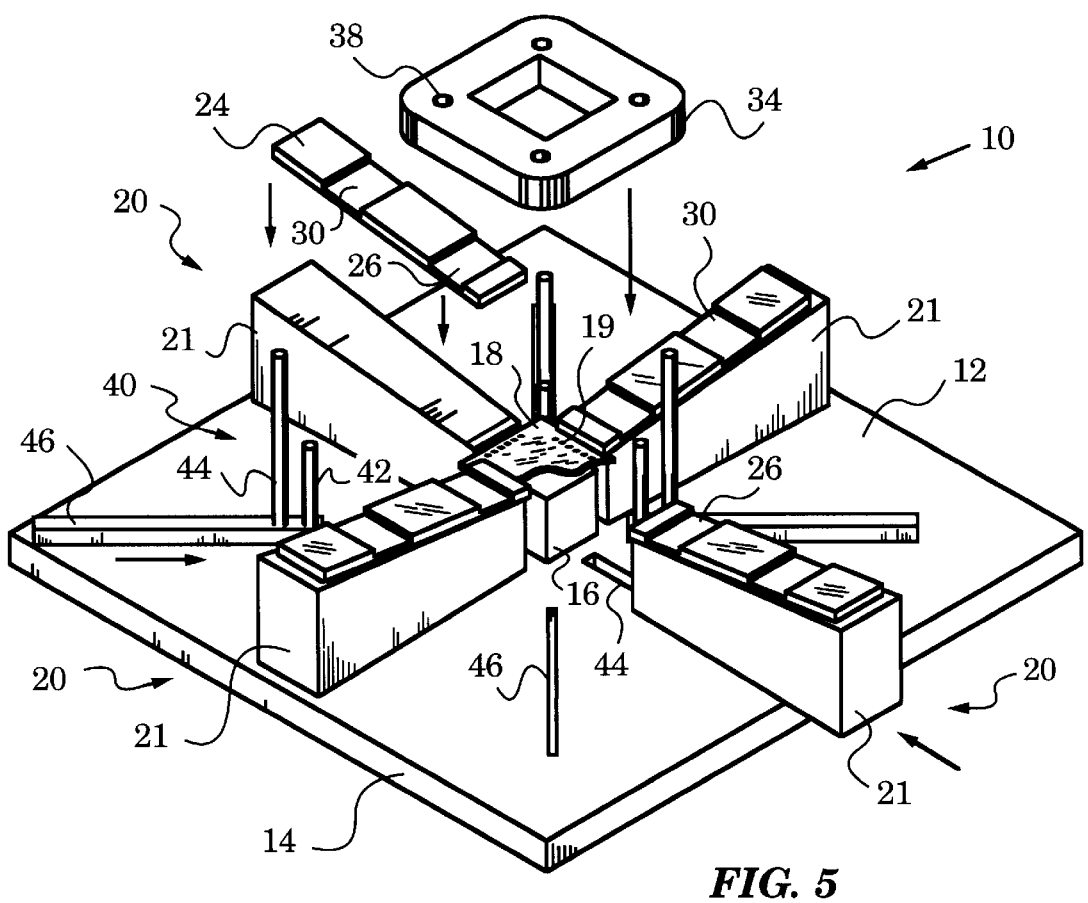
FIG. 5

ASSEMBLY STRUCTURE FOR MAKING INTEGRATED CIRCUIT CHIP PROBE CARDS

FIELD OF THE INVENTION

This invention relates generally to probe cards used to test integrated circuit chips. More particularly, it relates to the assembly structure used to manufacture such probe cards.

BACKGROUND OF THE INVENTION

In a typical integrated circuit (IC) chip, the input, output, power supply and other terminals of the circuit are formed by metalized contacts, usually deployed along the margins of the circuit pattern. The outline of the chip is often square, and the marginal locations of the contacts depend on the circuit configurations and the available marginal space. In some instances the contacts may lie in a uniform row or rows along the margins.

For the purpose of testing any type of integrated circuit patterns, before the application of leads to connect the contacts to other components, various types of test probe cards have been developed. The most commonly used probe card consists of a printed circuit board having a circular opening or port to provide access to contacts on an IC chip. This opening is surrounded by conductive probes connected to terminals on the card which, in turn, are connected to test equipment appropriate to the circuit. The number of probes in the opening determines the maximum capacity of the probe card.

Structures used to assemble typical test probe cards consist of a base containing a downward-pointing funnel. A number of probes 22 are laid in a circular manner around the base with the probe tips pointing down towards the center of the funnel, as shown in FIG. 1A. Due to the curvature of the funnel surface even probes lying next to each other, e.g., probes 22A and 22B at a fan out angle $\theta=0$ have different inclination angles $\beta_1$, and $\beta_2$ as indicated in FIG. 1B. In general, probes at a fan out angle $\theta$ will also have a different inclination angle $\beta$.

After probes 22 are adjusted on the funnel plane, a layer of epoxy is laid over them, as shown in FIG. 3. The epoxy is then hardened by heating and the structure of probes and epoxy is attached to a planar insulation card having a printed circuit and a port.

Since the probes are attached to the probe card in a circular manner, they touch contacts 106 located on an IC chip 105 at different fan out angles $\theta$, as illustrated in FIG. 2. A probe located in the center of a row of probes touches a contact located in the center of a row of contacts directly, at 0°. However, a probe located at the end of a row of probes requires a steeper fan out angle $\theta$ to reach a contact located at the end of a row of contacts, in the corner of the chip.

Since the probes are laid on an inclined assembly structure with the probe tips pointing downwards, as shown in FIG. 1A, they will form an inclination angle $\beta$ with the plane of the IC chip. Since the probes are laid on a non-planar surface, the inclination angle of each probe will vary greatly (see FIG. 1B). In general, probes at the end of the row will have a smaller inclination angle than the probes at the center of the row. The disparity in the inclination angles at which the probes are laid will cause the force between the probe tips and contacts of the IC chip to vary over a wide range.

This disparity also causes deformation of the probe tips when they are placed in the holes of the Mylar sheath. The bend angle of the tip changes and alignment of the probe tips suffers. The Mylar may also be dislodged or deformed by the probe tips, which could cause the alignment to suffer. Often if the inclination angles of the probes differ, the probe tips may even pop out of the Mylar holes, again causing problems with tip alignment and planarity. These events may cause differences in the force at which the probe tip touches the contact and prevent uniform scrub length.

When the probes touch the contacts on the chip, the probe tips scrub the contact surfaces to remove the oxide film, and thereby establish electrical contact, as shown by scrub mark 100 of FIG. 2. Disparity in the inclination angles of the probes will cause non-uniform scrub marks. In addition, because of fan out angles, some of the angles at which the probes touch the contacts are quite large (~25°–45°), and the scrubbing motion causes the tips to go beyond the contacts to invade the surface of the chip, as shown by scrub mark 102 of FIG. 2. These scrub marks damage the functionality of the IC chip by destroying the insulating passivation layer.

Since all of the contacts in an IC chip lie in a common plane and must be simultaneously engaged in order to carry out testing, it is essential that all probe tips lie in a plane parallel to the common IC plane. Consequently, a fundamental requirement for a probe card is planarization of the probe tips. After the probes have been adjusted to assume their proper angles, an epoxy is poured over the array of probes so as to embed them at their assigned angles and planes in the epoxy, as illustrated in FIG. 3. The epoxy is not contained, however, and often flows around the probes, dislodging them. Misalignment of the probes occurs so they are no longer at the correct angles or in the correct plane, as seen in FIG. 4. Thus a uniform contact force becomes impossible to achieve.

Because the epoxy flow is uncontrolled, it may run down the length of the probe, as shown in FIG. 3. The result is variance in the amount of probe exposed, also called beam length and indicated by reference L. One will thus get some probes with beam lengths L that are shorter or longer than others. The force at which a probe touches a contact on an IC chip depends to a large extent on the beam length and thus uniform beam lengths are crucial.

With a view to providing a test probe assembly that has uniform and consistent scrubbing characteristics, the Evans U.S. Pat. No. 4,599,599 discloses a structure in which a circular array of probes, all lying in a horizontal plane, are supported on a mounting ring surrounding a circular port in a card. The probes, converge toward the central region of the port below which is the chip to be tested, with the slope angle between each probe tip section and the surface of the chip uniform. Despite the fact that this probe card minimizes the problem of probes aligned on different planes, it still retains the fan out angles for probes touching contacts at the corners of the chip and the resulting scrubbing problem.

The Evans U.S. Pat. No. 4,719,417 discloses a structure for a multi-layered test probe assembly, which features two radial arrays of probes to test an exceptionally large number of contacts on an IC chip. It also retains the fan out angles for probes touching contacts at the corners of the chip and the resulting scrubbing problem.

OBJECTS AND ADVANTAGES OF THE INVENTION

Accordingly, it is a primary object of the present invention to construct an assembly structure for probe cards such that the probes can touch contacts on an integrated circuit chip directly at 0°; i.e. eliminating the fan out angle or making it negligible. This will result in a decrease in the number of contacts and IC chips damaged by scrubbing motions of the probe tips. It is an additional object of the invention to remove variances in the inclination angle β, which will remove the variances in contact force between the many probe tip and contact connections. Removal of the different inclination angles also prevents dislodgement or deformation of the Mylar sheath and the probe tips. It is an additional object of the invention to construct a probe card so that the probes are all located in the same plane by use of an epoxy groove, which prevents the epoxy layer from flowing and thus dislodging the probes after they have been positioned. Preventing the epoxy groove from flowing down the probes also allows control of the beam length, which is crucial for determining the force at which the probe tips touch the contacts of an IC chip. Probes located on a single plane will also remove the resulting variances in force between the many probe tip and contact connections. It is a further object of the present invention to provide these same benefits to a multi-layered probe card constructed in an analogous manner.

SUMMARY OF THE INVENTION

These objects and advantages are attained by a test probe card assembly structure used to construct probe cards to check integrated circuit chips before terminal leads are applied to the contacts thereof which are deployed on the chip in a common plane. The assembly structure has a base with a block attached to one side. A wing, having a planar face inclined towards the block, is attached to the same side. Two or more wings are attached at 90° angles to each other, depending on the nature of the IC chip and its contacts. The probes are laid on the wing in a parallel manner and at a constant inclination angle. The planar face of the wing has an epoxy groove to insure that the epoxy layer used to hold the probes in place does not flow. Epoxy flowing can disturb the parallel nature and plane of the probes, as well as vary the beam length. The planar face of the wing also has a tape groove to receive double-sided adhesive tape which is used to hold the probes in place, again preserving the parallel nature and plane of the probes. In the preferred embodiment, the wing can consist of two parts. One part is a support block, which has the planar face. The second part is a probe positioning element, which is a removable incline used to secure a sheath for keeping the probe tips in place. The sheath is commonly constructed of Mylar. A probe alignment control element, commonly a ring with at least one raised section, is placed over the epoxy layer to hold it and the probes in place. The probe alignment control element is stopped at a certain position in order to control the thickness of the epoxy layer. This is achieved by guiding members, commonly pins attached perpendicular to the base, in conjunction with recesses on the probe alignment control element. This assembly structure can be used to construct both single and multi-layered test probe cards.

DESCRIPTION OF THE FIGURES

FIG. 1A is an isometric view of a prior art test probe card assembly structure, with the probes aligned in a circular manner.

FIG. 1B is an isometric view of a prior art test probe card assembly structure, with the probes having different inclination angles β.

FIG. 2 is a top plan view of probes attached in a circular manner to a prior art test probe card testing a square integrated circuit chip at different angles.

FIG. 3 is a cross-section of a probe, held in place by an epoxy layer, being mounted on the prior art test probe card assembly structure.

FIG. 4 is a cross-section of three probes held in place by an epoxy layer in the prior art method.

FIG. 5 is an isometric view of the preferred embodiment of a test probe card assembly structure in accordance with the invention, with probe positioning elements and guiding mechanisms.

DETAILED DESCRIPTION

Figure 10:
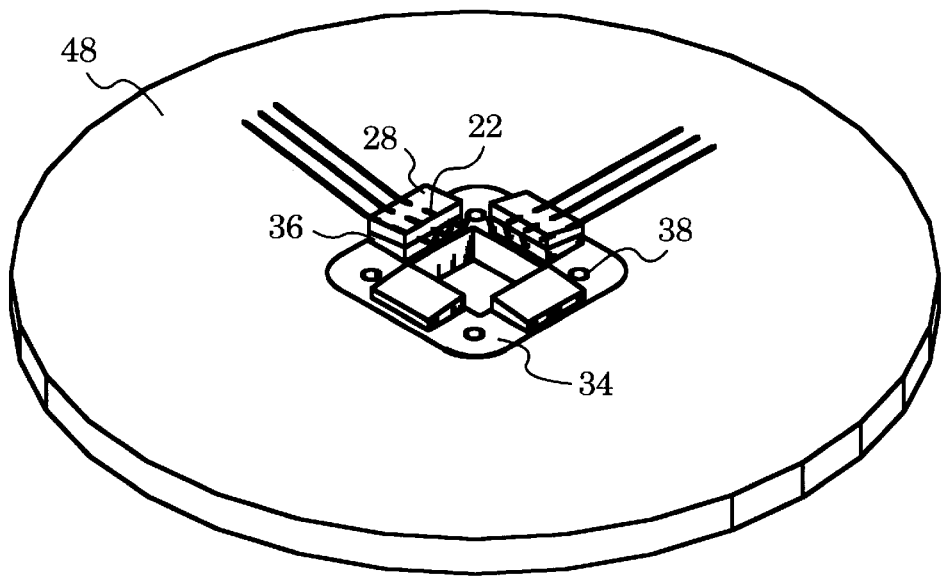
FIG. 10 is an isometric view of the resulting test probe card constructed on the preferred embodiment of a test probe card assembly structure in accordance with the invention.
Figure 11:
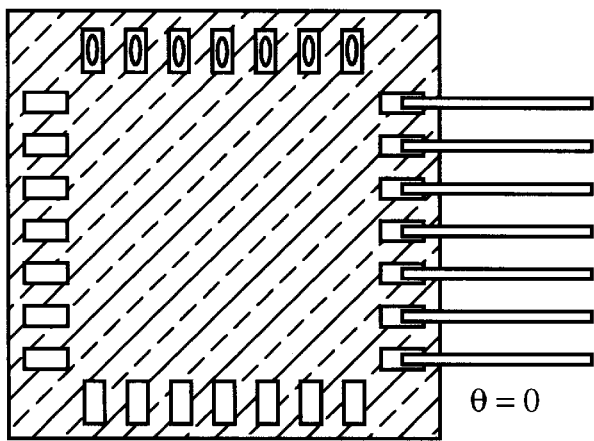
FIG. 11 is a top plan view of probes attached to a test probe card made on the preferred embodiment of a test probe card assembly structure in accordance with the invention testing a square integrated circuit chip at different angles.
Figure 12:
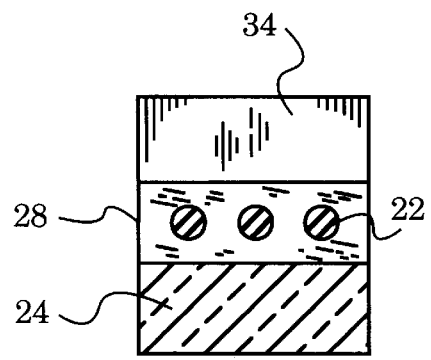
FIG. 12 is a cross-section of three probes held in place by an epoxy layer on the preferred embodiment of a test probe card assembly structure in accordance with the invention.

A preferred embodiment of the invention is shown in FIG. 10. The function of a test probe assembly structure is to allow construction of a test probe card which has probes arranged in a parallel manner and with the same inclination angle so as to touch the contacts of an integrated circuit chip directly, in the absence of fan out angles. Accordingly, the problem of uneven contact forces between probes and contacts and the problem of the probe tip scrubbing across the contact onto the surface of the chip should be minimized. There will also be less chance of dislodging or deforming the Mylar sheath and the probe tips. In addition, the inclusion of an epoxy groove to control epoxy flow should reduce misalignment of probes, as well as variances in beam length of the probes.

The construction of the preferred probe is performed in steps using an assembly structure 10 as shown in FIGS. 5–9.

A base 14 of test probe card assembly structure 10 is simply a piece of material of adequate size and strength to support construction of a test probe card. In practice, a square planar base formed from a rigid material is used.

Figure 6:
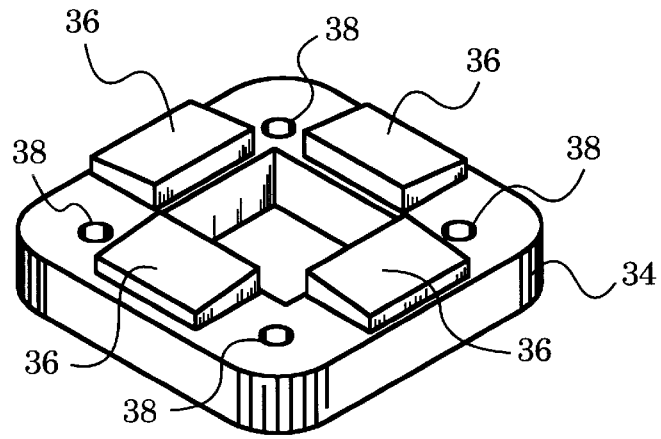
FIG. 6 is a lower left isometric view of the probe alignment control element with four raised sections and four recesses.
Figure 7A:
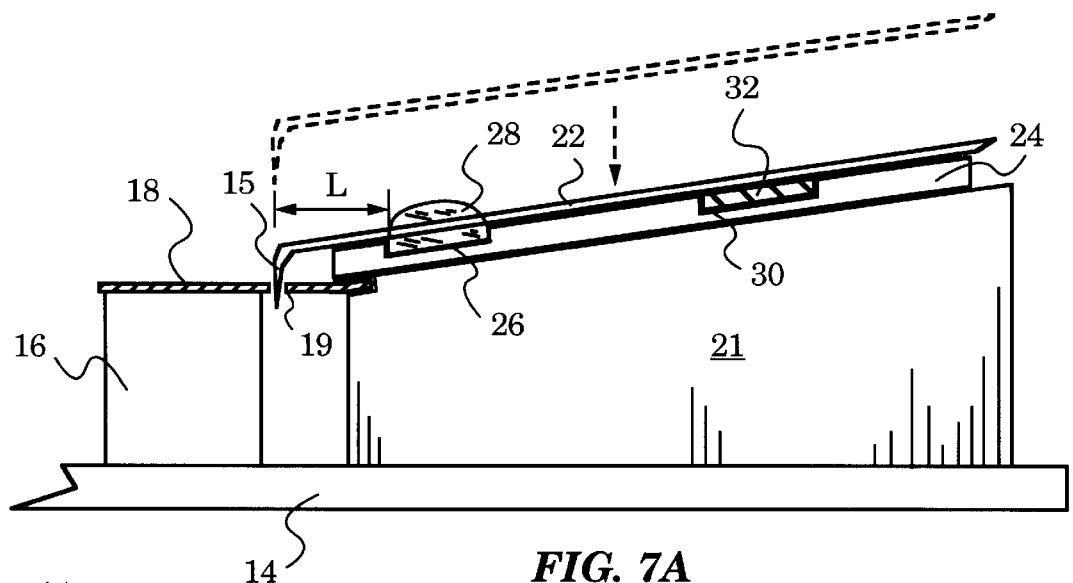
FIG. 7A is a cross-section of a probe being mounted on the preferred embodiment of a test probe card assembly structure in accordance with the invention.
Figure 7B:
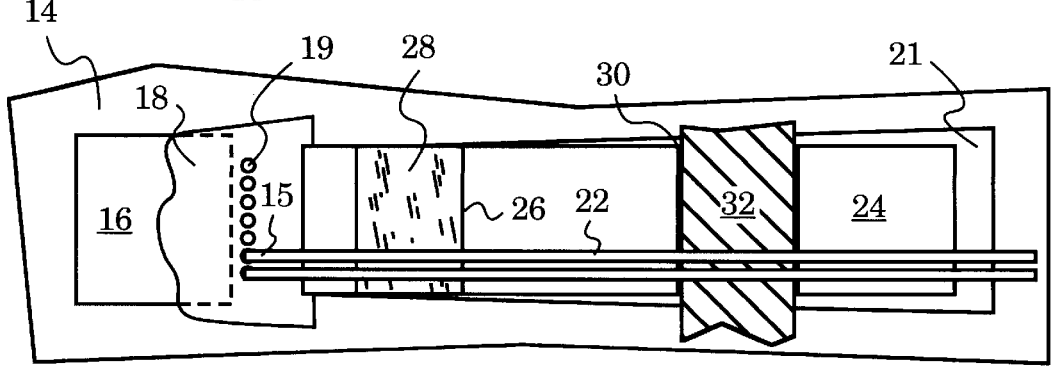
FIG. 7B is a top plan view of probes being mounted on the preferred embodiment of a test probe card assembly structure in accordance with the invention.
Figure 8:
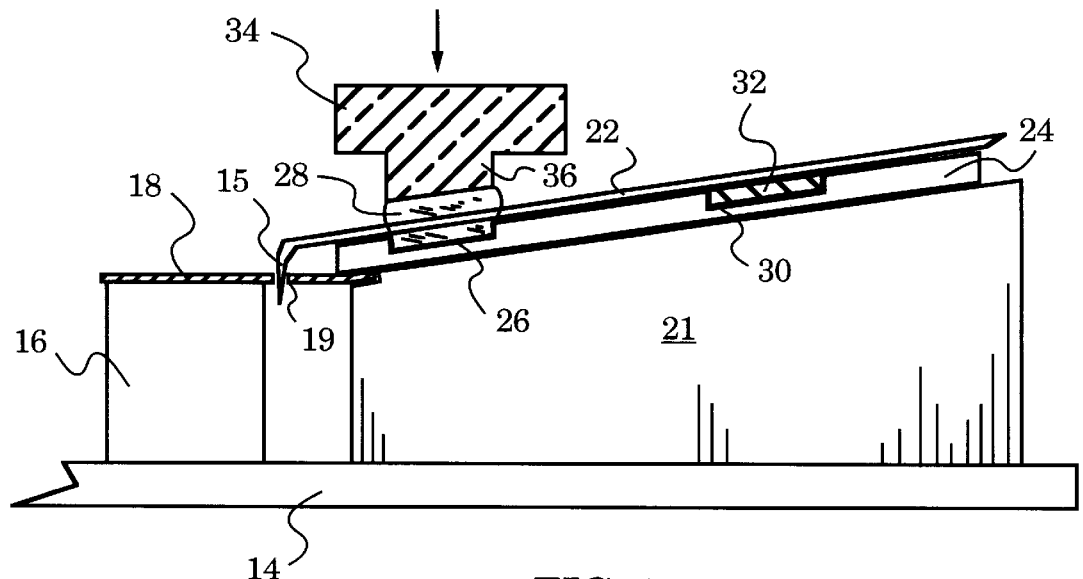
FIG. 8 is a cross-section of a probe being mounted using the epoxy groove and probe alignment control element of the preferred embodiment of a test probe card assembly structure in accordance with the invention.
Figure 9:
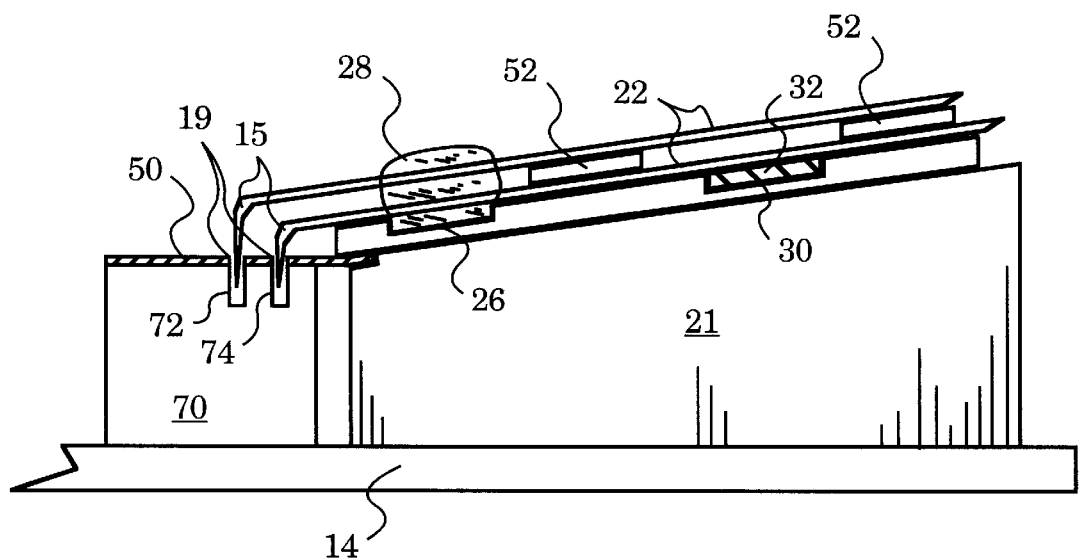
FIG. 9 is a cross-section of probes being mounted in a multi-layered manner on the preferred embodiment of a test probe card assembly structure in accordance with the invention.

A block 16 attached to a top side 12 of base 14 is used solely to support a sheath 18 for keeping probe tips 15 in place (see FIG. 7A). Block 16 may actually comprise any shape so long as it can support probe tip sheath 18.

Also attached to top side 12 of base 14 are wings 20, which may number from one to four. The purpose of wings 20 is to provide a surface on which to place probes 22 in a parallel manner and at a constant inclination angle so that probe tips 15 can touch the contacts of an integrated circuit chip directly, without a fan out angle and without variances in force between probe tips 22 and contacts of the IC chip.

Wings 20 can be constructed in two parts: a support structure 21 and a probe positioning structure 24. Support structure 21 is attached directly to base 14. It has a planar face which is inclined in the direction of block 16. The incline should end at the same height and adjacent to block 16. Probe positioning structure 24 is attached to top side 12 of support structure 20. It comprises a planar face, theoretically with the same circumference as the planar face of support structure 20. Probe positioning structure 24 has an epoxy groove 26 of predetermined length and width into which epoxy 28 can be poured (see FIG. 7A). Groove 26 is a recess which prevents epoxy 28 from flowing and thus causing misalignment of probes 22 and variance in beam length. In addition there is a tape groove 30 of predetermined length and width. Groove 30 is for placement of double-sided adhesive tape 32, which helps keep probes 22 in place.

Square sheath 18, commonly constructed of Mylar, is placed on top side 12 of block 16 and centered by two protruding pins (not shown). Sheath 18 contains small holes 19 along its perimeter where probe tips 15 will be placed. Mylar sheath 18 thus helps with the positioning of probes 22. Sheath 18 is not permanently attached to assembly structure 10. However, it is held in place by two part wing structure 20, specifically probe positioning structure 24. The result is that sheath 18 is fastened between support structure 21 and probe positioning structure 24. Various sheaths may be produced to satisfy the requirements of the probe card being constructed.

A probe alignment control element 34, commonly a ring (see FIG. 6), is used to compress epoxy layer 28 poured over probes 22. It contains at least one raised section 36 which contacts epoxy 28. In the construction of a probe card to test a square IC chip with contacts along all four sides, there are four raised sections 36. Section 36 is often ridged to provide better wetting of probe alignment control element 34 to epoxy 28. Probe alignment control element 34 is placed over epoxy layer 28 with raised section 36 corresponding in position with epoxy groove 26 of probe positioning structure 24. Probe alignment control element 34 contains at least one recess 38, such as a small hole, located near raised section 36, to fit with a guiding member 40, whose purpose is to help position probe alignment control element 34.

Guiding member 40 is commonly a pin attached perpendicular to top side 12 of base 14 between adjacent wings 20 and near block 16. Guiding members 40 fit into the recesses of probe alignment control element 34, thus determining its placement relative to epoxy groove 26 and epoxy layer 28. A stopping member 42 is also commonly a pin attached perpendicular to top side 12 of base 14 between adjacent wings 20 and near block 16. Stopping members 42 prevent probe alignment control element 34 from compressing epoxy layer 28 too far, thus determining its height relative to epoxy groove 26 and epoxy layer 28.

Test probe assembly structure 10 can be constructed with guiding mechanisms 44, 46 to allow movement of wings 20, guiding members 40, and stopping members 42 relative to each other. Guiding mechanisms 44, 46 are built into top side 12 of base 14 and operate much like slits, in that they allow different components 20, 40, 42 to be slid along base 14. However, any type of adjustable mechanism is feasible. Thus, it is possible that several different probe cards could be constructed on a single test probe assembly.

Construction of a Single-Layered Probe Card

Test probe card assembly structure 10 should be set up according to the specifications of the desired test probe card to be produced. In practice, all four wings 20 and at least two guiding members 40 will be used to construct the typical probe card used to test a square IC chip with contacts located on the perimeter. Suitable Mylar sheath 18 with the appropriate pattern of holes 19 for probe tips 15 is chosen and placed on top side 12 of block 16. Mylar sheath 18 may be secured in place by the use of two-structure wing 20, which allows probe positioning structure 24 to be placed over the edges of sheath 18 and fastened.

Epoxy 28 is poured into epoxy grooves 26 of wings 20 and allowed to cure for a few minutes. This curing helps prevent epoxy 28 from flowing around probes 22 when they are placed on planar face of wings 20. Pieces of double-sided adhesive tape 32 are placed in tape grooves 30. Probes 22 are then placed on wings 20, over epoxy grooves 26 and tape grooves 30, in a parallel manner and at a constant inclination angle, with probe tips 15 pointing down the inclines toward block 16. Probe tips 15 should fit into Mylar sheath 18 which has been placed on block 16. If all four wings 20 are used, probes 22 will form a square or rectangle, with probe tips 15 in each row positioned essentially parallel to each other and at a constant inclination angle.

Another layer of epoxy 28 is poured over probes 22, thereby securing them in place. Probe alignment control element 34 is then placed over epoxy 28, eased into place by guiding members 40 and stopping members 42. Guiding members 40 and stopping members 42 control the position and height of probe alignment control element 34 so that it compresses epoxy layer 28 according to the specifications of the test probe card being made. Raised sections 36 of probe alignment control element 34 contact epoxy layer 28 to form a secure attachment. Probe alignment control element 34 stays attached to epoxy layer 28 and probes 22. After epoxy layer 28 is hardened, the probe-epoxy structure is fastened to a planar printed circuit board 48.

Construction of a Multi-Layered Probe Card

Construction of a multi-layered test probe card can also be achieved on test probe card assembly structure 10. Setup of test probe assembly structure 10 for a multi-layered test probe is essentially the same as that for a single-layered test probe. In practice, all four wings 20 and at least two guiding members 40 will be used to construct the typical probe card used to test a square IC chip with contacts located in one or more rows on one side of the chip. Suitable Mylar sheath 50 with the appropriate pattern of holes 19 for probe tips 15 is chosen and placed on top side 12 of a block 16 for accommodating tips 15. If one is constructing a multi-layered probe card with one row of probes 22 located on two levels, the Mylar sheath 18 will have one row of holes 19 (see FIG. 13A). If one is constructing a multi-layered probe card with at least two rows of probes 22 located on two levels, there will be at least two rows of holes 19 on Mylar sheath 50 (see FIG. 13B). Mylar sheath 50 may be secured in place by the use of two-structure wing 20, which allows probe positioning structure 24 to be placed over the edges of sheath 50 and fastened.

The first layer of probes 22 is positioned and secured in much the same manner as described above for the single-layered probe card. However, after epoxy layer 28 is poured over probes 22, probe alignment control element 34 is not placed on top. Epoxy layer 28 is allowed to cure for a certain amount of time, much like first epoxy layer 28 poured into groove 26.

Spacer elements or another layer of double-sided adhesive tape 52 are then placed over the first layer of probes 22. Spacer elements or another layer of double-sided adhesive tape 52 are shorter in length than probe positioning structure 24 and do not contain epoxy groove 26. This is because the second layer of probes 22 will be placed in epoxy layer 28 that was poured over the first layer of probes 22. Spacer elements or another layer of double-sided adhesive tape 52 are supported by the edges of probe positioning structure 24.

The second layer of probes 22 is placed on spacer elements or another layer of double-sided adhesive tape 52. Probes 22 are positioned in a parallel manner and in the same plane. Probe tips 15 are positioned in the remaining empty holes 19 of Mylar sheath 50. Probes 22 are placed on epoxy layer 28 that was poured over the first layer of probes 22. A third layer of epoxy 28 is then added over the second layer of probes 22 to secure them in place. This third epoxy layer 28 is added over the previous epoxy layers 28.

At this point, it is possible to keep adding probe 22 and epoxy layers 28, although practical considerations suggest a maximum of layers as defined by the nature of the probe card to be constructed.

Probe alignment control element 34 used to construct the single-layered probe card is then placed over the epoxy 28, eased into place by guiding members 40 and stopping members 42 in the same manner as described previously. Probe alignment control element 34 stays attached to epoxy layer 28 and probes 22. After epoxy layer 28 is hardened, the multi-layered probe-epoxy structure is fastened to planar printed circuit board 48 just like the single-layered probe.

Figure 13A:
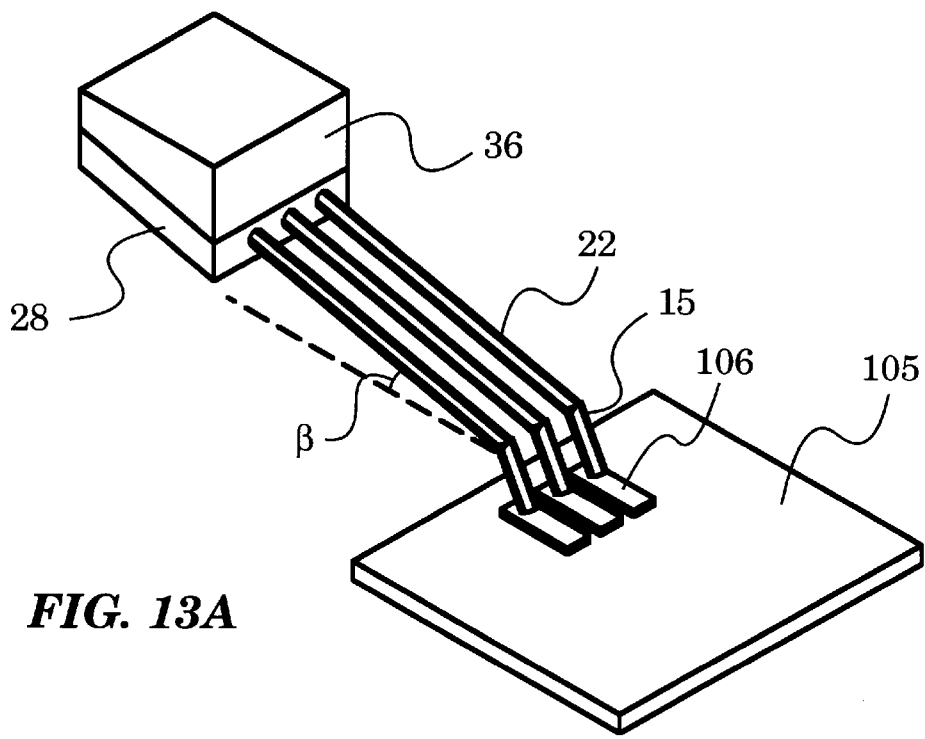
FIG. 13A is an isometric view of a single-layer probe card with probes located in the same row constructed on the preferred embodiment of a test probe card assembly structure.
Figure 13B:
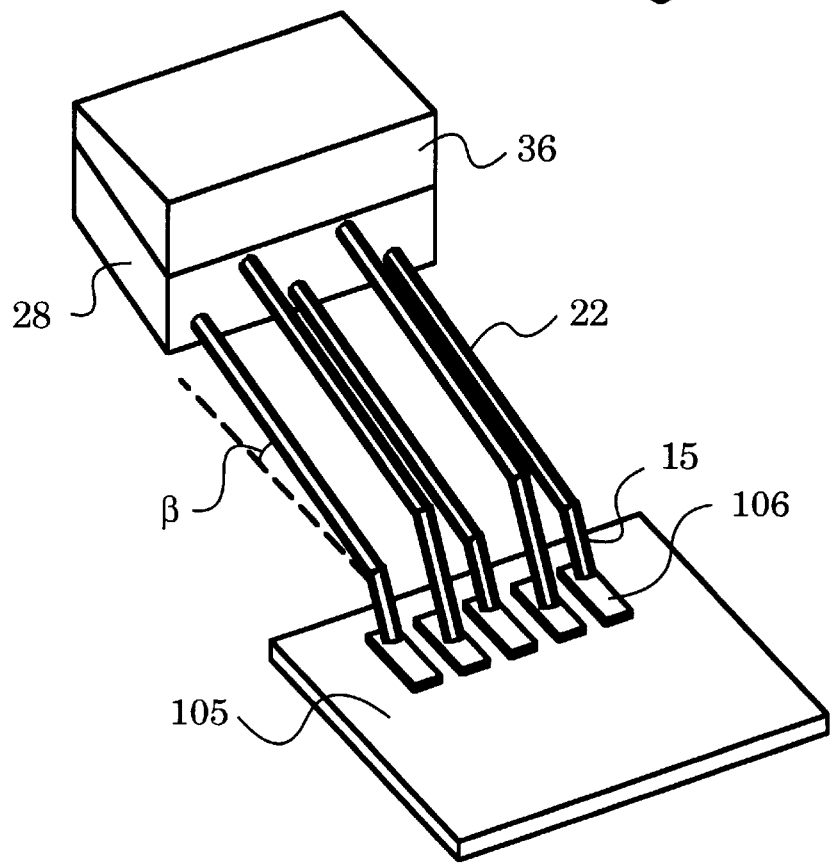
FIG. 13B is an isometric view of a multi-layered probe card with probes located in two rows constructed on the preferred embodiment of a test probe card assembly structure.

Some example types of probe cards which can be constructed on assembly structure 10 or any analogous structure according to the invention are shown in FIGS. 13A and 13B. FIG. 13A illustrates a straight section of a single-layer probe card. The inclination angles β of all three probes 22 shown are equal. Also, fan out angle θ of probes 22 is approximately zero. These conditions improve planarity and uniformity of contact force between probe tips 15 and circuit pads 106. This is important because in practice probes 22 frequently require post-production tweaking or bending to ensure planarity. With angles θ and β being constant the amount of tweaking required is minimized. Epoxy 28 is prone to damage during a tweaking session and its life is thus prolonged when the amount of tweaking required is reduced.

FIG. 13B shows a straight section of a dual-layered probe card made according to the invention. Once again, angles θ and β are controlled in this card.

It will be clear to one skilled in the art that the above embodiment may be altered in many ways without departing from the scope of the invention. For example, different shapes of integrated circuit chips can be accommodated by this invention. If one has an integrated circuit chip in the shape of a triangle with circuits located on the perimeter, a test probe card can be constructed whereby three rows of probes are arranged in a triangular shape. The assembly structure for such a probe card would consist of three wings arranged around a triangular block, with a triangular Mylar sheath. Thus many different shapes of IC chips can be accommodated.

In addition, it should be noted that in cases where many probes are placed in a single row, a small fan out angle θ may still exist. However, this angle θ will be essentially negligible. Accordingly, the scope of the invention should be determined by the following claims and their legal equivalents.

What is claimed is:

1. An assembly structure for making a probe card to test an integrated circuit chip, said assembly structure comprising:
   a) a base having a top side;
   b) a block attached to said top side;
   c) at least one wing having a planar face inclined in direction of said block for placing probes thereon, such that said probes are essentially parallel, said probes being held in place by an epoxy layer, and said probes having probe tips for contacting the pads of said integrated circuit chip;
   d) at least one guiding member mounted to said top side;
   e) a probe alignment control element having at least one protruding section for providing contact with said epoxy layer, said probe alignment control element being guided by said guiding member.

2. The assembly structure of claim 1, wherein said at least one wing consists of two sections, said support block and a probe positioning element, said support block comprising said planar face, said probe positioning element comprising a removable incline for securing a sheath for keeping said probe tips in place.

3. The assembly structure of claim 2, wherein said sheath is made of Mylar.

4. The assembly structure of claim 2, wherein said planar face comprises an epoxy groove for containing said epoxy layer, said epoxy layer securing said probes in a substantially parallel arrangement.

5. The assembly structure of claim 2, wherein said planar face comprises a tape groove for receiving a double-sided adhesive tape, said double-sided adhesive tape holding said probes in a substantially parallel arrangement.

6. The assembly structure of claim 1, wherein said at least one wing comprises four wings, located at 90° angles to each other.

7. The assembly structure of claim 6, wherein said probe alignment control element comprises four protruding sections, each of said four protruding sections corresponding to one of said four wings.

8. The assembly structure of claim 1, wherein said planar face comprises an epoxy groove for containing said epoxy layer, said epoxy layer securing said probes in a substantially parallel arrangement.

9. The assembly structure of claim 1, wherein said planar face comprises a tape groove for receiving a double-sided adhesive tape, said double-sided adhesive tape holding said probes in a substantially parallel arrangement.

10. The assembly structure of claim 1, wherein said at least one guiding member comprises four guiding members.

11. The assembly structure of claim 1, wherein said at least one guiding member is a pin.

12. The assembly structure of claim 9, wherein said pin is attached perpendicular to said top side.

13. The assembly structure of claim 1, wherein said guiding member comprises a stopping mechanism to arrest the position of said probe alignment control element in order to determine the thickness of said epoxy layer.

14. The assembly structure of claim 1, wherein said probe alignment control element is a ring.

15. The assembly structure of claim 1, wherein said probe alignment control element comprises at least one recess to fit with said guiding member.

16. The assembly structure of claim 1, wherein said assembly comprises a guide mechanism to adjust the position of said at least one wing and said at least one guiding member.

17. A method for making a probe card using an assembly structure comprising a base having a top side, said method comprising the following steps:

a) attaching a block to said top side;

b) attaching at least one wing having a planar face inclined in direction of said block;

c) placing probes on said at least one wing, such that said probes are essentially parallel;

d) holding said probes in place by an epoxy layer, said probes having probe tips for contacting pads of said integrated circuit chip;

e) mounting at least one guiding member to said top side;

f) using a probe alignment control element having at least one protruding section for providing contact with said epoxy layer, and said probe alignment control element being guided by said guiding member.

18. The method of claim 17, further comprising the step of attaching a removable incline to said at least one planar wing to secure a sheath for keeping said probe tips in place.

19. The method of claim 17, attaching a guide mechanism to said structure to adjust the positions of said at least one wing and said at least one guiding member.

20. The method of claim 17, placing said probes over each other to construct a multi-layered probe card.

21. A probe card manufactured according to the method of claim 17.

* * * * *